United States Patent [19]

Foster

[11] Patent Number: 4,720,395

[45] Date of Patent: Jan. 19, 1988

[54] LOW TEMPERATURE SILICON NITRIDE CVD PROCESS

[75] Inventor: Derrick W. Foster, Fremont, Calif.

[73] Assignee: Anicon, Inc., San Jose, Calif.

[21] Appl. No.: 899,923

[22] Filed: Aug. 25, 1986

[51] Int. Cl.$^4$ .......................... B05D 5/12; C23C 16/34
[52] U.S. Cl. .................................... 437/241; 427/237; 427/255; 427/255.2
[58] Field of Search ...................... 427/255.2, 255, 94, 427/95, 237

[56] References Cited

U.S. PATENT DOCUMENTS

| | | | |
|---|---|---|---|
| 4,118,539 | 10/1978 | Hirai et al. | 427/94 |
| 4,227,907 | 10/1980 | Merritt | 427/163 |
| 4,232,063 | 11/1980 | Rosler et al. | 427/94 |
| 4,452,874 | 6/1984 | Ogawa et al. | 427/74 |
| 4,452,875 | 6/1984 | Ogawa et al. | 427/74 |
| 4,495,218 | 1/1985 | Azuma et al. | 427/74 |
| 4,539,933 | 9/1985 | Campbell et al. | 118/728 |
| 4,582,020 | 4/1986 | Lean et al. | 118/728 |
| 4,588,610 | 5/1986 | Yamazaki | 427/94 |
| 4,626,449 | 12/1986 | Hirai et al. | 427/94 |
| 4,636,401 | 1/1987 | Yamazaki et al. | 427/255.2 |

*Primary Examiner*—Sadie L. Childs
*Attorney, Agent, or Firm*—William B. Walker

[57] ABSTRACT

Thermal CVD process for forming $Si_3N_4$-type films on substrates by reaction of gaseous $NF_3$ with gaseous disilane at a temperature in the range of 250°–500° C., at pressures of 0.1–10 Torr. The mole ratio of $NF_3$ to silane is in the range of 0.5–3.0 and the reaction zone is preferably isothermal (T controlled to within +5° C.). The resulting films have RI's in the range of 1.4 to 3.0. The process parameters can be controlled to dope the film with H and/or F, or to create zones of differing properties within the film. The process does not cause radiation damage, metal migration, stored charge dissipation or high levels of impurities. Control of distance between adjacent wafers and wafer-to-wall spacing combined with laminar gas flow gives excellent film thickness uniformity, on the order of below about ±5% across the wafer face, both within (across) wafers and from wafer to wafer (batch uniformity).

19 Claims, 1 Drawing Figure

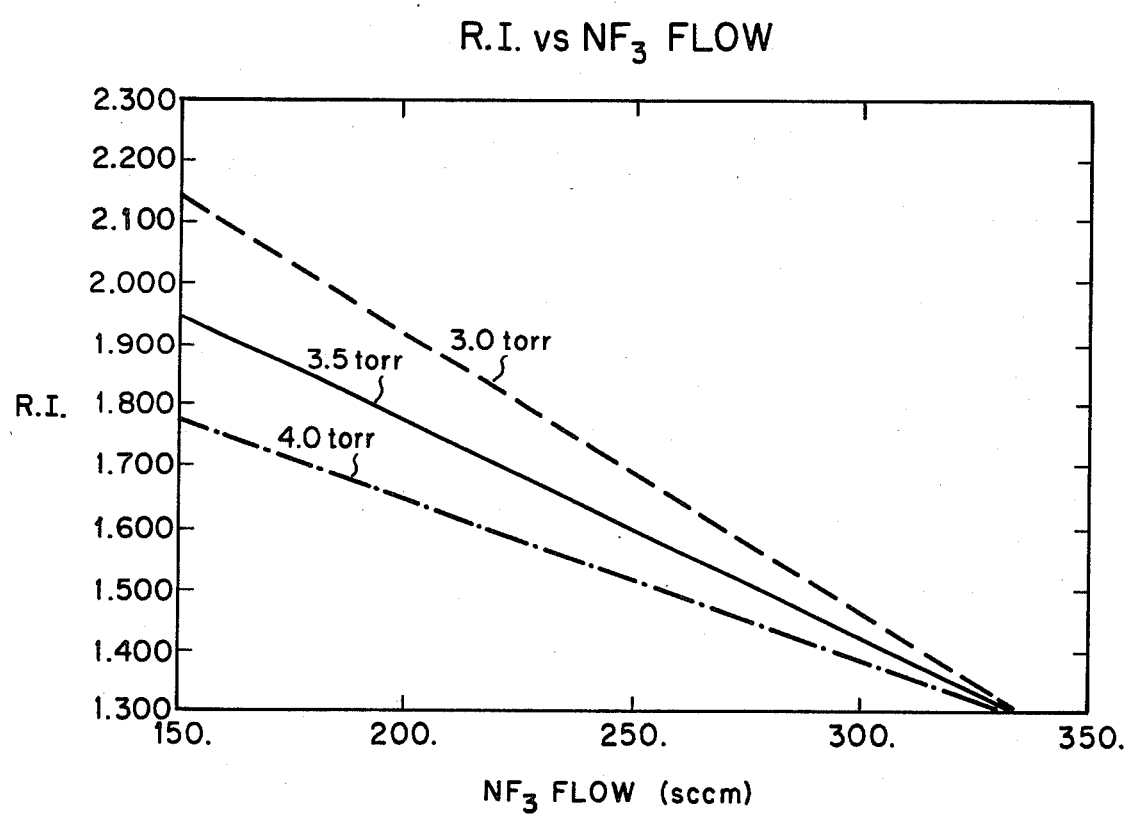
Fig_1

LOW TEMPERATURE SILICON NITRIDE CVD PROCESS

FIELD

This invention relates to processes for thermal chemical vapor deposition (CVD) of silicon nitride, $Si_3N_4$, on various substrates, including silicon wafers, and the film so formed. More particularly the invention comprises thermal CVD reaction of one or more silanes with $NF_3$ at low temperatures (on the order of 400° C. and below) to deposit thin $Si_3N_4$ films on substrates. Of particular interest are $Si_3N_4$ films formed from $NF_3$ and disilane ($Si_2H_6$) which function as passivation films, etch masks, protective layers, and MNOS (Metal Nitride Oxide Semiconductor) system gates in integrated circuit technology.

BACKGROUND

There are three basic CVD methods of producing $Si_3N_4$ films on substrates: The thermal method, the plasma method, and the photo-excitation method. However, each presents serious problems that have prevented widespread use of $Si_3N_4$ films as insulating or protective layers, particularly in the semiconductor and integrated circuit fields.

The Thermal Method.

This method involves thermal reaction of a gas mixture containing $SiH_4$ and ammonia at high temperatures, typically 700°–1000° C. This process has not been used in the semiconductor field because transistors cannot be subjected to the 700° C. and higher temperatures without seriously affecting or destroying their performance capabilities to a point where production output is uneconomic.

Typical of thermal processes is that shown by Rosler et al. in U.S. Pat. No. 4,232,063, wherein the reaction of monosilane ($SiH_4$) with ammonia at 800°–900° C. forms $Si_3N_4$ in a hot-wall reactor in which the wafers are placed vertically on a quartz wafer carrier.

In Hirai et al. U.S. Pat. No. 4,118,539, a super hard, crystalline $Si_3N_4$ coating is produced on a heated substrate by a thermal CVD process at 500°–1900° C., preferably 1000°–1600° C. A concentric pipe assembly blows individual streams of gases onto the heated substrate, with the nitrogen source gas being surrounded by the silicon source. Silicon halides, silicon hydrides (including $Si_2H_6$), and silicon hydrogen hydrides are reacted with nitrogen hydrides (including ammonia) and ammonium halides.

Hirai et al. also gives a description of several prior art thermal CVD processes circa the mid-1970's involving the use of monosilane or silicon halides plus ammonia at substrate temperatures of 400° C. and above.

The Plasma Method.

In attempts to achieve lower temperatures, plasma CVD methods have been tried wherein a discharge plasma is applied to the reaction gases in the region close to the substrate surface. The plasma method, while cooler than 700° C., generates serious radiation damage. For example, the radiation field causes metals to migrate, the reaction stoichiometry cannot be controlled, the film thickness and integrity is not uniform or satisfactory, and by-products are introduced into the film. In addition, the dissipation of stored charges by the radiation field prevents any use for MOS devices.

Nitrogen trifluoride gas is incidentally mentioned, among other compounds, in a series of Canon Company plasma method patents as a way to introduce nitrogen atoms into a silicon matrix layer. The matrix layer is used as an adhesion layer between a substrate and a photoconductive layer for copier drums. These plasma method patents and the mention of $NF_3$ are: Ogawa et al. U.S. Pat. No. 4,452,875 (col. 6, lines 13–24); Shimizu et al. U.S. Pat. No. 4,394,426 (col. 16, lines 13–20); Kanbe et al. U.S. Pat. No. 4,420,546 (col. 6, lines 20–32); Shirai et al. (Shirai I) U.S. Pat. No. 4,405,702 (col. 9, lines 9–26); Shirai et al. (Shirai II) U.S. Pat. No. 4,461,820 (col. 8, lines 38–50); and Shirai et al. (Shirai III) U.S. Pat. No. 4,464,451 (col. 7, line 68, col. 8, lines 1–5; and col. 23, lines 36–46).

The Ogawa et al. U.S. Pat. No. 4,452,875 of Canon is directed to a photosensitive copier drum in which one or more interface layers of an amorphous Si-containing material are provided. These interface layers are primarily for the purpose of enhancement of adhesion between a metal support such as an aluminum copier drum, and an overlying rectifying layer which functions primarily for preventing migration of charges from the aluminum drum into photosensitive amorphous layer(s) overlying the reactifying layer. The interface layer is coated directly onto the drum. It is covered by an overlay of the rectifying layer and at least two amorphous overcoating layers. An additional interface layer may be interposed between the rectifying layer and the two photosensitive amorphous overcoating layers. The upper amorphous layer is a sealer which provides humidity resistance, abrasion resistance, dielectric strength and environmental characteristics in use and durability. It protects the underlying first amorphous layer which is the photosensitive layer of the copier drum.

There is omnibus disclosure in columns 5–6 of the Ogawa et al. patent directed to a list of a number of silanes, (monosilane, disilane, trisilane and tetrasilane) as a gas for supplying silicon (col. 5, lines 39–45). Nitrogen atoms are introduced into the interface layer which is described as an amorphous material containing silicon atoms as a matrix and nitrogen atoms, if desired, together with at least one member of the group of hydrogen atoms and halogen atoms as constituent atoms. The matrix is designated as "a-SIN(H,X)", meaning an amorphous silicon matrix containing nitrogen, and optionally hydrogen and halogen, as constituent atoms. The patent lists in an omnibus disclosure the folllwing as a starting gas for introduction of nitrogen in the amorphous silicon interface layer matrix: nitrogen, ammonia, hydrazine, hydrogen azide, ammonium azide, nitrogen trifluoride, and nitrogen tetrafluoride (col. 6, lines 13–24).

The interface layer is applied to the drum by a plasma method (glow discharge and sputtering in combination), which involves an electrode to which high power is applied and on which are placed high purity silicon nitride wafers, at a desired sputter area ratio, as targets. The heated support is spaced from the sputter targets on the electrode and the space between is evacuated. In the actual examples, Ogawa et al. discloses only nitrogen gas or ammonia gas to provide the nitrogen atom dopant for the silicon and silicon nitride powders sputtered onto the support (aluminum drum) surface.

In the Ogawa et al. examples, only monosilane and ammonia in a ratio of 1 to 30 is used in the sputtering method. This is not a proper stoichiometric ratio for formation of silicon nitride under the plasma discharge conditions shown in the Ogawa et al. patent. Thus, Ogawa et al., in spite of the incidental mention in an omnibus plasma method disclosure of disilane and nitrogen trifluoride, does not teach a process for producing silicon nitride films in a thermal low temperature CVD process. Rather, they dope a matrix of silicon and silicon nitride with nitrogen, hydrogen and halogen by using a gas atmosphere in a high voltage plasma process. The resulting Ogawa et al. film is employed as an adhesion layer directly on a metal substrate.

The Photo-Excitation Method.

A recently reported development is a high energy photo excitation method as described in Azuma et al. U.S. Pat. No. 4,495,218. This method uses ultraviolet radiation as an energy source for pyrolysis of a polysilane, alone to produce an Si film, with $O_2$ or an oxygen-containing reactive gas to produce an $SiO_2$ film, or with ammonia to produce $Si_3N_4$. While the reaction temperature is reported to be in the range of 20°–300° C., the process has the disadvantage of requiring the presence of a small vessel of mercury heated to 30°–40° C. The UV light source disclosed in the examples was either a low pressure mercury lamp or an excimer laser (KrF, 249 nm). In the case of preparing $Si_3N_4$ by the reaction of disilane with ammonia, the film forming rate was 150 Angstroms/min.

Another example of laser-induced photochemical process is shown in U.S. Pat. No. 4,227,907 of Merritt, wherein a silicon optical fiber, freshly drawn at about 2000° C., is immediately hermetically sealed by cladding with $Si_3N_4$ by passing the freshly drawn fiber through a chamber having a controlled atmosphere of $SiX_4$ and $NX_3$, wherein X is H and/or F, irradiated with a $CO_2$ laser.

In related U.S. Pat. No. 4,270,997, Merritt also discloses the preparation of bulk powdered $Si_3N_4$ at room temperature by reaction of $SiH_4$ plus $NF_3$ by the laser photochemical technique.

Other References.

Nitrogen trifluoride has also been used as a source of nitrogen for preparing nitrogen-doped silica glass as disclosed in Edahiro et al. U.S. Pat. No. 4,402,720 (col. 4, lines 28–34).

Accordingly, there is a great need in the art for a low temperature thermal CVD process that does not have the disadvantages of the high temperature process or the high energy plasma and photo-excitation processes.

THE INVENTION

OBJECTS

It is among the objects of the invention to provide an improved thermal CVD process for production of silicon nitride-type films at significantly lower temperatures than prior art thermal processes, yet does not have the disadvantages of high energy processes, such as plasma or photo-excitation methods.

It is another object of the invention to provide an improved thermal CVD process which operates in the low temperature range of 250°–500° C. to produce silicon nitride-type films.

It is another object of the invention to provide an improved $Si_3N_4$ film by reaction of $NF_3$ and disilane in a low temperature thermal CVD process.

It is another object of the invention to provide an improved low temperature CVD process which produced improved silicon nitride-type films having refractive indices in the range of about 1.4–3.0.

Still other objects will be evident from the following descriptions and claims.

DRAWING

FIG. 1 shows a graph of Refractive Index vs. $NF_3$ flow rate at various reaction chamber pressures.

SUMMARY

The improved low temperature silicon nitride film CVD process of this invention comprises passing $NF_3$ and disilane, $Si_2H_6$, gases at a temperature in the range of 250°–500° C. into contact with a heated substrate for a time sufficient to form a silicon nitride film of a preselected desired thickness range.

The mole ratios of $NF_3$ to disilane are controlled in the range from about 0.5 to about 3.0, with the optimum being about $2.66 \pm 0.2$, to produce $Si_3N_4$-type films. The refractive index of the resultant films is in the range of from about 1.4 to about 3.0, the optimum being about $2.0 \pm 0.2$. The lower the refractive index the higher in N, and the higher the RI the higher in Si. The term "silicon nitride-type films" or "$Si_3N_4$-type films" as used herein means films formed with a refractive index in the above range.

Substrates may be any material on which a silicon nitride film is desired, e.g.: Si wafers; plastic, resin, glass or metal objects or films; GaAs layers; or any semiconductor layer or device employing Groups III to V elements or compounds, such as MNOS system gates in integrated circuit technology. The substrate is heated to the reaction temperature by a resistance element in a reaction chamber into which the gases are introduced. It is preferred that the inner surfaces of the reaction chamber be substantially free of, or low in, evolvable or reactive oxygen or oxygen-containing compounds to reduce the incidence of oxygen contamination of the silicon nitride-type films. In a preferred embodiment of the process, the reaction chamber is prepared for film production by the preliminary step of passivating the chamber with a silicon nitride-type film of this invention.

While not critical, it is preferred to maintain the reaction chamber isothermal, by which is meant having temperature variations throughout of less than 5° C., preferably ±2° C. The reactant gases are input at ambient temperature a sufficient distance from the wafers to be coated to permit the gases to reach reaction temperature. Compared to the wafer mass, the gases, at ambient temperature will not appreciably cool the wafer. Indeed, since the reaction is exothermic, heat loss in exhaust gas is substantially balanced by the reaction heat contribution.

The gases may be introduced via separate inlet lines, or they may be introduced coaxially. A suitable apparatus for the process is shown in U.S. Pat. No. 4,539,933. In addition, a hot wall closed boat CVD apparatus may be employed, such as is shown in U.S. Pat. No. 4,582,020. The reaction gases are introduced to be present in substantially laminar flow over the substrate surface. The residence time over the substrate is kept short to eliminate substantial concentration variations over the wafer. The substrate, typically an Si wafer, is preferably confined in a manner so as to provide ratios of cage (wafer boat) wall to wafer edge spacing, and wafer to adjacent wafer spacing, such that the silicon nitride-type films produced by the process of this invention are substantially uniform across the wafer surface, i.e., do not exhibit substantial concavity (edge build-up) or convexity (center mounding). Appropriate spacing ratios which may be used are shown in U.S. Pat. No. 4,582,020. Film uniformity obtained exhibits less than ±5% thickness variation, both within (across) the wafers, and from wafer to wafer in a batch or production run.

Typical gas flow rates may be on the order of from about 100 to about 400 standard cc/min for the disilane, and from about 100 standard cc/min to 1 L/min for the $NF_3$. Setting the reaction chamber pressure and the flow rate of one reactant permits control of film properties, as expressed by the refractive index (RI), by varying the flow rate of the other reactant. Thus, for a given pressure and silane flow rate, increasing the $NF_3$ flow rate reduces the RI of the film. Likewise, increasing pressure reduces the RI because more F and H become incorporated in the film. The reaction chamber pressures are controlled in the range of from about 0.1 Torr to 10 Torr, with the preferred range being from about 2 to about 5 Torr.

Film formation rate is typically in the range of from about 10 to about 500 Angstroms/minute with typical operating rates being on the order of from about 30–300 A/min, with the optimum being 100 A/min at a pressure of about 3 Torr at 400° C. Thus, for instance, an Si-rich film as measured by RI, may be produced by employing a low $NF_3$ flow rate. Then the pressure may be let run up to dope the film with H and F reaction by-products. The degree of doping can be controlled by control of the relative flow rates of the reactants and the pressure, and the resulting film properties can be relatively quickly and continuously monitored by checking the RI. This permits precise control of film properties. Further, the low temperature of reaction provides a growth rate sufficiently moderate to be controllable yet sufficiently high to be suitble for commercial production.

The amorphous silicon nitride-type films of this invention having RI's in the region of 2.0 are particularly dense when the reaction chamber pressure is kept low and the etch rate is low, i.e., less than about 100 A/min. As the growth rate increases, the RI goes down. The RI can also be increased by decreasing the mole ratio of $NF_3$ to disilane.

The process of this invention does not cause radiation damage, metal migration, stored charge dissipation, or high levels of impurities in the film. The RI, thickness, uniformity, density and doping (to produce semiconductive characteristics) can be controlled to within relatively precise ranges.

DETAILED DESCRIPTION OF THE BEST MODE OF THE INVENTION

The following detailed description of the best mode of carrying out the invention is by way of example and not by way of limitation of the principles of the invention.

In all of the following examples, an Anicon Series 1000 Model CVD reactor was employed, the general configuration being as illustrated in U.S. Pat. No. 4,539,933. The silane was introduced via the T-tube secondary injector, and the $NF_3$ via the shepherd's crook primary injector tube. The wafers were all 4″ silicon wafers placed in a vertical orientation inside an Anicon silicon oxide (quartz) boat of the type shown in U.S. Pat. No. 4,582,020. The mole ratio reported below is that of $NF_3$ to $Si_2H_6$, and the average growth rate (G.R.) is reported in Angstroms/min.

TABLE I

| Film Production at 400° C. and 200 Std cc/min Disilane | | | | | |
|---|---|---|---|---|---|
| Ex. | Time (min) | NF3 SCCM | Mole Ratio | Press Torr | G.R. A/min | R.I.* |
| 1 | 30 | 188 | .94 | 4.0 | 36.17 | 1.784 |
| 2 | 80 | | | 3.0 | 34.84 | 1.933 |
| 3 | 70 | | | 3.5 | 31.66 | 1.799 |
| 4 | 70 | | | 4.5 | 122 | 1.628 |
| 5 | 70 | 219 | 1.09 | 3.0 | 46.93 | 1.99 |
| 6 | 60 | | | 3.5 | 86.53 | 1.867 |
| 7 | 55 | | | 4.0 | 112.7 | 1.469 |
| 8 | 60 | | | 4.5 | 126.12 | 1.484 |
| 9 | 60 | 250 | 1.25 | 3.0 | 113.2 | 1.497 |
| 10 | 55 | | | 3.5 | 98.76 | 1.382 |
| 11 | 50 | | | 4.0 | 28.32 | 1.466 |
| 12 | 55 | | | 4.5 | 79.56 | 1.446 |
| 13 | 55 | 282 | 1.41 | 3.0 | 84.38 | 1.549 |
| 14 | 50 | | | 3.5 | 106.16 | 1.46 |
| 15 | 45 | | | 4.0 | 105.47 | 1.429 |
| 16 | 40 | | | 4.5 | 77.63 | 1.354 |
| 17 | 70 | 313 | 1.56 | 3.0 | 77.9 | 1.444 |
| 18 | 60 | | | 3.5 | 89.13 | 1.451 |
| 19 | 55 | | | 4.0 | 41.67 | 1.354 |
| 20 | 70 | 219 | 1.09 | 3.0 | 36.58 | 1.734 |

*Refractive Index of deposited film.

DISCUSSION

Uniformity and growth rate were found to be a function of wafer spacing (distance between adjacent wafers) and of wafer-to-wall spacing. Uniformity of film thickness across the wafer can be controlled and maintained to less than about ±5% both Within Wafers (WIW), and from Wafer to Wafer (WW; batch uniformity).

FIG. 1 is a best fit diagram of the Refractive Index vs. $NF_3$ flow rate at a fixed $Si_2H_6$ flow rate of 200 Scc/min at three different pressures, 3.0, 3.5 and 4.0 Torr. The figure shows an inverse, relatively linear relationship. The reactor was maintained at 400° C.

In the process of this invention, one or more of the reactant flow rate(s) and pressure in the reaction zone portion of the CVD apparatus can be varied during the deposition of the film to provide a gradient in the film properties as measured by its refractive index. Thus, a film rich in Si may be started on the substrate surface and gradually grade off to being stoichiometric $Si_3N_4$, or rich in N, or highly doped with H and/or F. The high-Si film offers good adhesion, e.g., to a glass surface, and the highly doped top surface will be relatively semiconductive or photoconductive. Conversely, a photoconductive zone of the film may be deposited first, followed by a protective passivation zone of relatively stoichiometrically pure $Si_3N_4$, e.g., for photocopy drum use. The zones can blend gradually, one into another. Two, three or more zones can be deposited in a single, continuous, gradient(s)-containing layer by this technique.

It should be understood that various modifications within the scope of this invention can be made by one of ordinary skill in the art without departing from the spirit thereof. I therefore wish my invention to be defined by the scope of the appended claims as broadly as the prior art will permit, and in view of this specification if need be.

I claim:

1. A thermal CVD process for forming silicon nitride-type films comprising the steps of:
   (a) introducing $NF_3$ and $Si_2H_6$ as reactant gases into a CVD reaction zone containing a substrate on which a silicon nitride-type film is to be formed;

(b) maintaining the temperature of said zone and said substrate within the range of from 250° C. to about 400° C.;
(c) maintaining the pressure in said zone in the range of about 0.1 to about 10 Torr; and
(d) passing said gases into contact with said substrate for a period of time sufficient to form a silicon nitride-type film thereon having a refractive index in the range of from about 1.4 to about 3.0;

wherein the gases react to form the films without plasma activation or irradiation.

2. A thermal CVD process as in claim 1, wherein:
(a) the mole ratio of $NF_3$ to silane is in the range of from about 0.5 to about 3.0.

3. A thermal CVD process as in claim 2, wherein:
(a) said substrate is a silicon wafer, a metal object, a film having one or more Group III, IV or V elements or compounds, or a semiconductor device.

4. A thermal CVD process as in claim 1, wherein:
(a) said reaction zone is maintained substantially isothermal.

5. A thermal CVD process as in claim 1, wherein:
(a) the flow rate of said $NF_3$ gas is in the range of from about 100 Scc/min to about 1 Liter/min; and
(b) the flow rate of said disilane is in the range of from about 100 Scc/min to about 400 Scc/min.

6. A thermal CVD process as in claim 2, wherein:
(a) said mole ratio is 2.66±0.2.

7. A thermal CVD process as in claim 1, wherein:
(a) said refractive index is 2.0±0.2.

8. A thermal CVD process as in claim 1, wherein:
(a) said pressure is in the range from about 2 Torr to about 5 Torr.

9. A thermal CVD process as in claim 1, wherein:
(a) said film formation rate is maintained in the range of from about 10 to about 500 Angstroms/minute.

10. A thermal CVD process as in claim 9, wherein:
(a) said film formation rate is in the range of from about 30 to about 300 Angstroms/minute.

11. A thermal CVD process as in claim 1, wherein:
(a) said substrate is disposed in a CVD boat; and
(b) the substrate-to-wall and substrate-to-substrate distances are selected to substantially eliminate concavity or convexity in deposition of said film on said substrate.

12. A thermal CVD process as in claim 1, wherein said reaction zone is disposed in a reaction chamber or boat having a passivation film on at least a portion of the surface thereof.

13. A thermal CVD process as in claim 1, wherein said reaction zone is disposed in a reaction chamber or boat, said substrate is the reaction chamber surface or boat surface, and the silicon nitride-type film formed on the surface thereof is a passivation film.

14. A thermal CVD process as in claim 1, wherein:
(a) the property of said resultant silicon nitride-type film is controlled by preselecting and maintaining the flow rates of said gaseous reactants for a preselected pressure.

15. A thermal CVD process as in claim 14, which includes the steps of:
(a) controlling said flow rates to produce a film rich in Si;
(b) increasing the pressure in said reaction zone to dope said film with a member selected from H, F and mixtures thereof to produce a semiconductive film.

16. A thermal CVD process as in claim 14, which includes the steps of:
(a) selecting and maintaining a substantiall fixed sialne flow rate and reaction zone pressure; and
(b) increasing said $NF_3$ flow rate to reduce the refractive index of said resultant film.

17. A thermal CVD process as in claim 14, which includes the steps of:
(a) selecting and maintaining a substantially fixed $NF_3$ flow rate and reaction zone pressure; and
(b) increasing said silane flow rate to increase the refractive index of said resultant film.

18. A thermal CVD process as in claim 14, wherein:
(a) one more of said flow rate(s) and pressure is varied during the deposition of said film to produce a film having at least one refractive index gradient therein.

19. A thermal CVD process as in claim 5, wherein:
(a) said mole ratio and flow rate and pressure are maintained to produce a film substantially stoichiometrically $Si_3N_4$.

* * * * *